United States Patent [19]
Premkumar et al.

[11] Patent Number: 5,775,403
[45] Date of Patent: Jul. 7, 1998

[54] INCORPORATING PARTIALLY SINTERED PREFORMS IN METAL MATRIX COMPOSITES

[75] Inventors: M. K. Premkumar; Ralph R. Sawtell, both of Monroeville; Frankie E. Phelps, Apollo; James A. DerKacy, Bethel Park, all of Pa.; David L Yun, Orange, Conn.

[73] Assignee: Aluminum Company of America, Pittsburgh, Pa.

[21] Appl. No.: 482,389

[22] Filed: Jun. 7, 1995

Related U.S. Application Data

[60] Continuation-in-part of Ser. No. 444,171, May 18, 1995, Pat. No. 5,616,421, which is a division of Ser. No. 235,018, Apr. 28, 1994, Pat. No. 5,570,502, which is a continuation-in-part of Ser. No. 111,993, Aug. 25, 1993, abandoned, which is a division of Ser. No. 682,513, Apr. 8, 1991, Pat. No. 5,259,436.

[51] Int. Cl.⁶ .......................... B22D 17/10; B22D 19/02; B22D 19/14
[52] U.S. Cl. ................. 164/98; 164/97; 164/113
[58] Field of Search .................. 164/97, 98, 113

[56] References Cited

U.S. PATENT DOCUMENTS

| | | |
|---|---|---|
| 3,350,763 | 11/1967 | Kingsbury et al. |
| 3,547,180 | 12/1970 | Cochran et al. |
| 3,718,441 | 2/1973 | Landingham ............ 29/182.1 |
| 3,721,841 | 3/1973 | Wilson |
| 3,868,267 | 2/1975 | Gazza et al. .............. 117/22 |
| 3,909,209 | 9/1975 | Kruper et al. |
| 4,033,400 | 7/1977 | Gurwell et al. ............ 164/98 |
| 4,205,418 | 6/1980 | Przybylek |
| 4,270,986 | 6/1981 | Smith |
| 4,340,109 | 7/1982 | Roddy |
| 4,352,450 | 10/1982 | Edgington |
| 4,376,804 | 3/1983 | Katzman |
| 4,573,517 | 3/1986 | Booth et al. |

(List continued on next page.)

FOREIGN PATENT DOCUMENTS

| | | |
|---|---|---|
| 115742 | 8/1984 | European Pat. Off. |
| 58-215263 | 12/1983 | Japan |
| 60-145340 | 7/1985 | Japan |
| 61-3649 | 1/1986 | Japan ............ 164/97 |
| 62-238063 | 10/1987 | Japan |
| 62-240152 | 10/1987 | Japan |
| 64-83634 | 3/1989 | Japan |
| 9010516 | 9/1990 | WIPO |
| 9117279 | 11/1991 | WIPO |
| 9217297 | 10/1992 | WIPO |
| 9418139 | 8/1994 | WIPO |

OTHER PUBLICATIONS

P.K. Robatgi et al., Solidification Processing of Metal-Matrix Composites, Proceddings of the International Symposium on Advanced Structural Materials, Montreal, Canada, Aug. 22-28, 1985, Pergamon Press, pp. 43-51, 478-481.

M.S. Newkirk et al, Preparation of Lanxide Ceramic Matrix Composites: Matrix Formation by the Directed Oxidation of Molten Metals, Ceram. Eng. Sci. Proc., 8(7-8) pp. 879-885 (1987).

(List continued on next page.)

*Primary Examiner*—Kuang Y. Lin
*Attorney, Agent, or Firm*—Tracey D. Beiriger; Edward L. Levine

[57] ABSTRACT

A method of fabricating MMCs having high thermal conductivity coupled with coefficient of thermal expansion (CTE) values which approximates the CTE of ceramics and semi-conductor materials typically used in electronic packaging. The method comprises preparing a formed agglomeration of powder particles (preform); partially sintering the preform; placing the partially sintered preform into a forming chamber; infiltrating the preform with liquid-phase metal; and allowing the liquid-phase metal to solidify and form an MMC around and through the preform. In a preferred embodiment, the preform is constructed from silicon carbide, and the metal matrix is an aluminum-silicon alloy.

24 Claims, 4 Drawing Sheets

U.S. PATENT DOCUMENTS

| | | |
|---|---|---|
| 4,613,069 | 9/1986 | Falke et al. . |
| 4,760,240 | 7/1988 | Iikawa et al. . |
| 4,761,345 | 8/1988 | Sato et al. . |
| 4,770,953 | 9/1988 | Horiguchi et al. . |
| 4,777,998 | 10/1988 | Charbonnier . |
| 4,806,704 | 2/1989 | Belke, Jr. et al. . |
| 4,889,177 | 12/1989 | Charbonnier et al. . |
| 4,901,780 | 2/1990 | Sasaki et al. . |
| 4,901,781 | 2/1990 | Ruff . |
| 4,906,511 | 3/1990 | Sato et al. . |
| 4,920,864 | 5/1990 | Skingle et al. . |
| 4,946,090 | 8/1990 | Hepburn . |
| 4,958,763 | 9/1990 | Divecha et al. . |
| 4,961,461 | 10/1990 | Klier et al. . |
| 5,076,344 | 12/1991 | Fields et al. . |
| 5,111,871 | 5/1992 | Cook . |
| 5,113,925 | 5/1992 | Cook ............................................ 164/97 |
| 5,130,498 | 7/1992 | Yoshida et al. . |
| 5,194,202 | 3/1993 | Yun et al. ................................ 164/103 |

OTHER PUBLICATIONS

C.R. Cook et al, System Optimization for Squeeze Cast Composites, Conference Proceedings of the 1988 World Materials Congress, Sep. 24–30, Chicago, Illinois, pp. 195–204.

A.J. Cook et al, Pressure Infiltration Casting of Metal Matrix Composites, Material Science and Engineering, A144 (1991) 189–206.

T.B. Shaffer et al, Highly Ceramic Loaded Net Shape Metal Matrix Composites, SAE Technical Paper No. 910832, Society of Automotive Engineers, Warrendale, Pennsylvania.

D.E. Hammond, Foundry Practice for the First Castable Aluminum/Ceramic Composite Material, Duralcan, San Diego, CA, Modern Casting, Aug. 1989, pp. 29–33.

N.R. Wymer, Die Casting Duralcan Aluminum Composites, Duralcan USA, Southfield, Michigan, Die Casting Engineer, pp. 16 and 18.

INCORPORATING PARTIALLY SINTERED PREFORMS IN METAL MATRIX COMPOSITES

CROSS-REFERENCE TO RELATED APPLICATIONS

The present invention is a continuation-in-part of co-pending U.S. Ser. No. 08/444,171, filed May 18, 1995, now U.S. Pat. No. 5,616,421, which is a division of U.S. Ser. No. 08/235,018, filed Apr. 28, 1994, now U.S. Pat. No. 5,570,502, which is a continuation-in-part of U.S. Ser. No. 08/111,993, filed Aug. 25, 1993, now abandoned, which is a division of U.S. Ser. No. 07/682,513, filed Apr. 8, 1991, now U.S. Pat. No. 5,259,436, issued Nov. 9, 1993.

TECHNICAL FIELD

The present invention relates to the manufacture of MMCs by vacuum die casting. More particularly, the method of manufacture relates to fabricating MMCs having high thermal conductivity coupled with coefficient of thermal expansion (CTE) values which approximates the CTE of ceramics and semi-conductor materials.

BACKGROUND OF THE INVENTION

Metal matrix composites (MMC) have been fabricated since the early 1960's primarily by powder metallurgy techniques. Recently, however, casting methods have been more frequently utilized due to a great saving in manufacturing costs. The most common approach of producing shaped MMC products via the casting method is to infiltrate open spaces (pores) of packed aggregate beds or preforms with molten matrix.

In the past, the processes employed for fabrication of MMCs include a vacuum/low pressure infiltration, a high pressure squeeze casting process, and a pressureless casting process. These processes have the following characteristics:

Low Pressure/Vacuum Infiltration Process

The process utilizes a combination of vacuum and a low pressure (less than 1500 psi) gas for metal infiltration. The process has been employed mainly for fabrication of small numbers of R&D samples. It is designed to be a laboratory scale process and is not suitable for low cost, high throughput production in commercial scale.

Pressureless Infiltration Process

The process relies on capillary force for the infiltration. To develop the capillary force, a wetting between aggregate and matrix materials is obtained through a chemical reaction. The process requires the use of special combinations of matrix alloying element (aluminum with 1 wt. % Mg or higher), heated ceramic aggregates (700° C. or higher), and gas environment (10 to 100 vol. % nitrogen). This process thus limits selection of matrix material, for instance to Al—Mg alloys, and is burdened by high manufacturing costs due to extended reaction periods. This process is additionally difficult from a process control standpoint due to the sensitive dependence of the process on surface condition and spontaneous wetting.

High Pressure Squeeze Casting Process

For the infiltration, this process utilizes only high pressure (10,000 to 30,000 psi) using a large hydraulic or mechanical press. The process has the ability to infiltrate a wide range of aggregate and matrix combinations but is quite limited as to complexity and dimensional tolerance of the products produced because of limitations in die design imposed by the needs for high pressure. The product manufacturing costs are also high because of high capital costs for the needed large press.

U.S. Pat. No. 4,920,864 generally discloses a closed-die pressure casting process to achieve infiltration of a matrix alloy into the interstices of a fiber preform. U.S. Pat. No. 4,777,998 shows die casting of metal parts possibly containing fibers of ceramic materials, but no attempt is made to utilize vacuum die casting principles.

It was against this background that the present invention was made.

SUMMARY OF THE INVENTION

It is an object of the invention to provide an MMC production process which has a combination of quality, repeatability, and flexibility which is superior to previous processes, particularly for making MMCs having a high volume fraction of aggregate.

Another object of the invention is the provision of aluminum or aluminum alloy and silicon carbide MMCs having unique combinations of electrical properties, thermal expansion coefficient and thermal conductivity.

These as well as other objects which will become apparent from the disclosure which follows are achieved according to the systems of Applicants' invention through the use of a vacuum die casting process for fabrication of MMC products. The process has the ability to produce high quality, net shape, or near net shape, thin-walled and complexly shaped MMC materials using a variety of aggregate and matrix combinations. The process involves various systems: machinery, aggregate, thermal treatments, vacuum and metal input.

In accordance with the present invention, there is provided a method of fabricating MMCs having high thermal conductivity coupled with coefficient of thermal expansion (CTE) values which approximate the CTE of ceramics and semi-conductor materials typically used in electronic packaging. The method comprises: (a) preparing a formed agglomeration of powder particles (preform); (b) partially sintering the preform; (c) placing the partially sintered preform into a forming chamber; (d) infiltrating the preform with liquid-phase metal; and (e) allowing the liquid-phase metal to solidify and form an MMC around and through the preform. In a preferred embodiment, the preform is constructed from silicon carbide, and the metal matrix is an aluminum-silicon alloy. When placing the partially-sintered agglomeration into the forming chamber (i.e., a die cavity), the partially sintered agglomeration may have a temperature between approximately 550° and 850° C. After partially sintering the agglomeration of powder particles (preform), but prior to placing the agglomeration into the forming chamber, the partially sintered agglomeration may be cooled to room temperature. The die cavity (forming chamber) may be heated to a temperature between approximately 150° and 500° C.

BRIEF DESCRIPTION OF THE DRAWINGS

Other feature of the present invention will be further described in the following related description of the preferred embodiment which is to be considered together with the accompanying drawings wherein like figures refer to like parts and further wherein:

In FIG. 2b, the lid is in place.

DEFINITIONS

Figure 1:
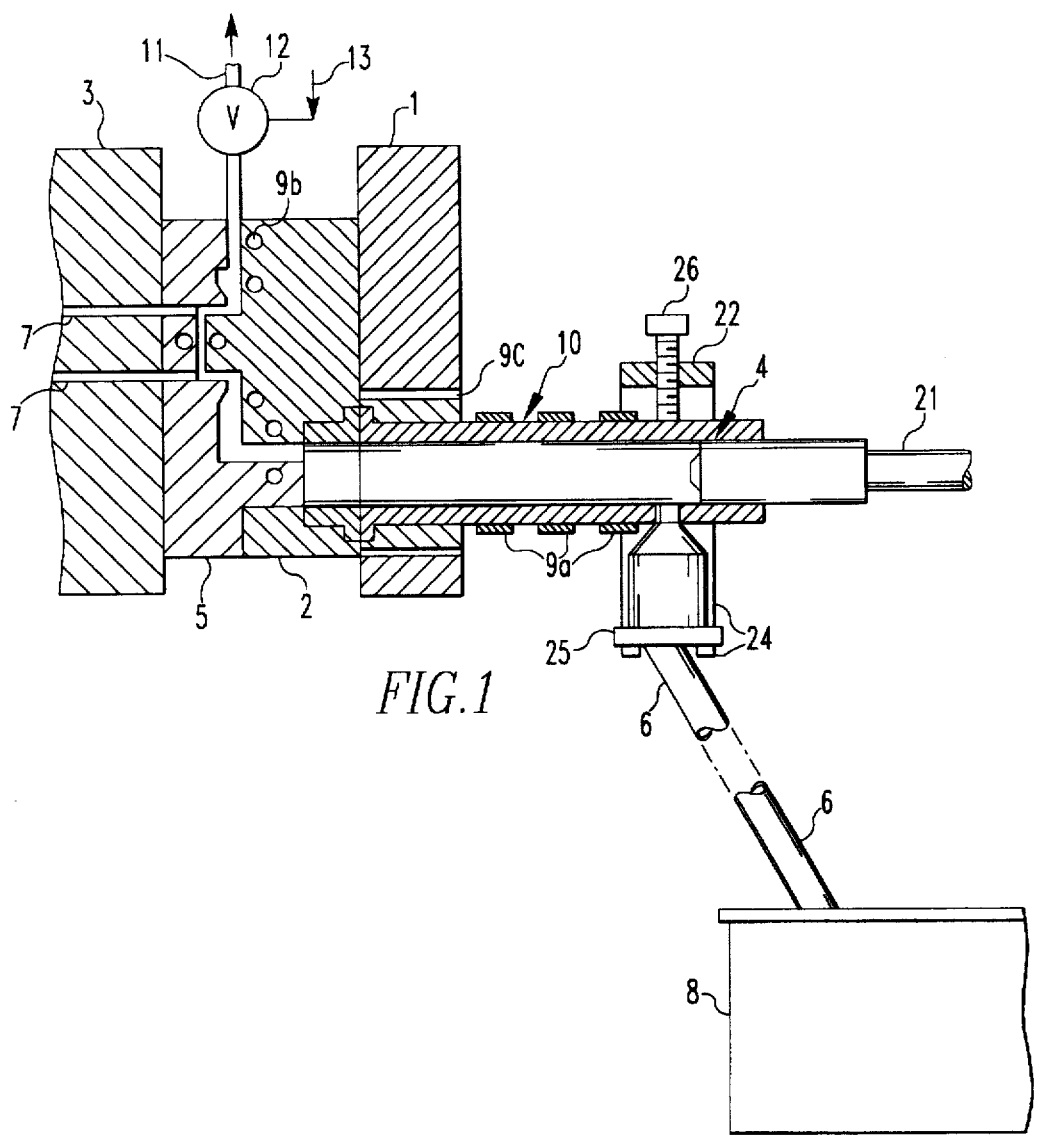
FIG. 1 shows a side view, partially in section, of a die-casting machine for use in carrying out the invention.

The term "high volume fraction" is used herein to mean a volume fraction between 50 vol. % and 80 vol. % or higher.

The terms "liquid-phase metal" and "molten metal" are used interchangeably herein to describe all fluid and semi-fluid phases in which the metal is not completely solidified. The terms include metal slurry and semi-solid phases and liquid metal containing undissolved ceramic particles.

The terms "metal matrix composite", "composite" or the initials "MMC" are used herein to mean a material comprising a two- or three-dimensionally interconnected alloy or metal matrix which has embedded therein reinforcement materials. The metal matrix may be formed by infiltrating molten metal containing reinforcement material into a preform or mass of aggregate.

The term "partial sintering" is used herein to mean heating the formed agglomeration of powder particles to a temperature, between approximately 1650° and 2000° C. in a substantially inert atmosphere, sufficient to begin the sintering process without creating a substantial portion of closed porosity. The temperature used to partially sinter the formed agglomerate is dependent on the composition of the aggregate material.

The phrases "preform" or "porous preform" are used herein to mean a formed agglomeration of reinforcement material or aggregate which is manufactured with at least one surface boundary which essentially defines a boundary for infiltrating liquid-phase metal. The preform retains sufficient shape integrity and strength to provide dimensional integrity prior to being infiltrated by the liquid-phase metal. The preform is sufficiently porous to accommodate infiltration by the liquid-phase metal. A preform may exist either singularly or as an assemblage of two or more separable parts. If separable preforms are used, they need not interlock mechanically or otherwise.

The terms "reinforcement material" or "aggregate" are used herein to refer to ceramic, metal, cermet and polymer having a form in the shape of fibers, whiskers, filaments, particles, ribbon, wire flake, crystals and platelets. Alternatively, the reinforcement material may be a porous preform formed from reinforcement material. Examples of materials for the reinforcement, in addition to the SiC of this invention, may include carbon, graphite, silicon nitride, boron carbide, tungsten, molybdenum, boron nitride, beryllium, fused silica, mullite, glass, aluminum nitrides, borosilicate, and oxides, nitrides, carbides, and borides such as zirconia, boron carbide, alumina and aluminum silicate (mullite) and combinations thereof and similar materials.

The term "thin-walled" is used herein to describe a part having a section, such as a wall, web, or fin (which may be a plate fin or a pin fin), whose minimum thickness is a function of the particle size and is generally $\leq 0.1$ inch, preferably $\leq 0.05$ inch, and even $\leq 0.03$ inch.

The term "tacking" is used herein to mean heating the formed agglomeration of powder particles to a temperature between 600° and 1000° C. in an oxidizing atmosphere so as to oxidize the aggregate particles such that a thin glassy surface forms which in turn bonds the particles of the aggregate together.

The terms "uni-cast" and "single cast" are used synonymously herein to refer to MMCs that are formed by a single metal infiltration operation which forms a monolithic matrix body. The monolithic structure means that there is no joint in the structure which might otherwise interfere with heat flow.

Mode for Carrying Out the Invention

Liquid-phase fabrication methods are particularly suited for the production of MMCs. Liquid-phase metal is infiltrated into and surrounds a porous preform. The metal is then cooled or allowed to cool to form a reinforced mass of continuous metal.

The die casting machinery which is used in the present invention comprises the die casting machine itself, dies and vacuum equipment such as that shown in U.S. Pat. No. 5,259,436 and the references cited therein.

The machine typically includes a fill chamber into which a measured amount of molten metal is collected, and a driven piston for moving the measured metal to the die. The piston drive causes the piston to employ a moderate infiltration pressure (usually less than 10,000 psi) on the metal. Die halves are mounted on fixed and movable platens. The die may be multi-cavity, in order to produce several products at once.

Vacuum equipment is connected for evacuating the die cavity and the fill chamber, in order to remove gas that could otherwise cause porosity in the MMC. The resulting reduction in the presence of oxygen caused by air removal is particularly advantageous in the case of MMCs having matrix and/or aggregate components whose oxidation can lead to decreased properties. Removal of the gas is also advantageous in the filling of the die cavity and infiltration.

Prior to casting, the die cavity, fill chamber, and piston may receive treatments for lubrication, casting release, etc.

The aggregate of an MMC may be provided by filling the die cavity with packed consolidated particles, in the form of a so-called preform, placed into the die cavity.

Preforms are formed, porous bodies constituted by pieces of aggregate bonded together by a suitable binder for providing green strength. The binder may be an organic material, in which case it is preferred to heat treat the preform prior to placing it into the die cavity; the heat treatment, if done at a sufficiently high enough temperature, volatilizes the organic material to remove it from the preform and bonds the pieces of aggregate together. Heating the formed agglomeration (preform) to a temperature between 300° and 500° C. is contemplated. In order not to close the pores, which must later receive metal matrix, a partial bond is preferred. The binder may also be an inorganic material, such as sodium silicate, where the presence of residues is not harmful to the end use of the MMC product. Binderless preforms may also be used where the aggregate is bonded together by a mechanical interlocking of the individual aggregate pieces. See the article "Highly Ceramic Loaded Net Shape Metal Matrix Composites" by T. B. Shaffer et al., SAE Technical Paper No. 910832, Society of Automotive Engineers, Warrendale, Pa. Finally, the preform may be bonded by sintering treatment. Such bonding permits the forming of composites having a high thermal conductivity and a CTE approaching ceramics and semi-conductor materials typically used for electronic packaging.

The metal input system includes the equipment and procedure for introducing metal into the fill chamber of the die casting machine, followed by driving the metal charge from the fill chamber by the piston moving within the chamber. The molten metal moves from the fill chamber and is gated into the die cavity to infiltrate the preform or aggregate.

Three exemplary metal input systems are the pour system, the suction system and the pressure transfer system. In the pour system, a desired amount of molten metal is poured through an opening in the top of the fill chamber whereupon the piston moves forward to block the opening to permit the vacuum system to evacuate the die and fill chamber. In the suction system, pressure below atmospheric is used to suck molten metal into the fill chamber. In the pressure transfer system, a pressure differential is used to push the molten metal into the fill chamber.

Aluminum alloys are a preferred material for the matrix, and examples of such alloys are included in the Examples below. However, other matrix materials may be used, one example being essentially pure aluminum. Depending on, for instance, materials of construction for dies and fill chamber, other metals may be copper, silver, gold, and alloys thereof.

Heating means are provided in the fill chamber and in the dies to assure that the molten metal does not solidify until the reinforcing aggregate has been completely infiltrated. Following completion of infiltration, a rapid solidification is advantageous to attain the desirable metallurgical properties of the matrix and, in cases where such has a tendency to happen, to prevent molten metal reaction with, or dissolution of, aggregate. It is also desirable that solidification be directional, proceeding along a front toward the molten metal source, in order to produce the least possible level of solidification shrinkage. These needs, to get complete infiltration, followed by rapid, and, desirably, directional solidification, require a balancing, or timed control, of temperature conditions. It can be of benefit to allow some interaction between molten matrix and aggregate, in order to improve interfacial bonding, so there may be a limit on just how rapid solidification should be. However, a particular advantage of the vacuum-assisted pressure die casting process of the present invention is that it provides the ability to combine rapid infiltration and solidification to minimize or eliminate potentially deleterious reactions between the molten metal and the aggregate or reinforcement.

A special advantage of the invention has been found to lie in its ability to achieve substantially porosity-free MMCs containing a high volume fraction of aggregate, particularly volume fractions of 50 vol. % and above, for instance up to 80 vol. %, and even 85 vol. % and above. This is achieved according to the invention by loading the die cavities of vacuum die casting machines with aggregate preforms made, for instance, of particles having distribution of sizes, in order to obtain the interstitial filling needed for high volume fractions. If the preforms are thermally treated for strength and removal of an organic binder, care must be taken not to create excessive amounts of closed voids because otherwise the matrix infiltration would be blocked, and the resulting MMC product would not be pore-free. In being careful, however, not to carry the bonding too far, the preform inherently achieved is not as strong as it could be otherwise. This means that infiltration velocity must be controlled so as not to erode the preform. It has been discovered that the lower pressures of die casting, as compared to those used in squeeze casting, coupled with the prior evacuation used in the vacuum die casting process and control of metal velocity, result in a proper balance of conditions, such that, without damaging highly loaded preforms, high volume fraction aggregate MMC of adequate strength can be achieved.

Thus, distinctive features of MMC products of the invention include an substantially pore-free product with a high aggregate loading at near net shape. Complex configurations characterized by thin (less than 0.1 inch, down to 0.05 inch and even to 0.03 inch and less) walls and highly angled mating surfaces can be produced owing to the unique characteristics of the process, notably the use of vacuum, which lowers infiltration pressures while maintaining the ability to fully penetrate preforms with high aggregate loading. Thus, the advantage of employing vacuum die casting over conventional die or squeeze casting is characterized by the ability to produce high quality, substantially pore-free MMC with high aggregate loading in complex configurations. These other conventional processes suffer in their inability to produce either substantially pore-free material or complex configurations.

In the context of materials for electronic packaging, the present invention makes possible, for instance, the manufacture of aluminum matrix MMCs having high thermal conductivity coupled with coefficient of thermal expansion (CTE) values considerably less than that of aluminum. The ability of the invention to manufacture complex MMC shapes makes possible, for instance, production of an integrated thermal management system for electronic packaging. This system includes, for instance, a monolithically combined heat exchanger and electronic package lid.

A surface layer of aggregate-free matrix material may be provided on the MMC products of the invention during the vacuum die casting to facilitate the processes.

Process and Equipment

Referring to FIG. 1, this Figure shows a modified cold chamber, horizontal vacuum die casting machine, including essentially only the region of the fixed clamping plate 1, or platen, with the fixed die, or mold half 2 and the movable clamping plate 3, or platen, with the movable die, or mold half 5 of the die casting machine, together with the piston 4, suction tube 6 for molten metal supply, holding furnace 8, and fill chamber 10. The suction tube 6 is connected to the fill chamber 10 by means of a clamp 22. Clamp 22 has a lower hook-shaped, forked tongue 24 which passes underneath an annular flange 25 on the suction tube 6. From the top, a screw 26 is threaded through the clamp 22. This enables a clamping of the end of suction tube 6 to the inlet orifice of the fill chamber 10. Ejector pins (not shown), may be provided through passageways 7 to provide means for removing the cast product when the die halves are opened following solidification of the molten metal matrix.

The vacuum line 11, for evacuating the die chamber by removing air and other gases in the direction of the arrow, is connected to the die in the area where the die is last filled by incoming molten metal. Line 11 is opened and shut using valve 12, which may be operated via control line 13 by control equipment (not shown).

Drive means (not shown) is provided to push the piston via the drive rod 21 to develop a metal injection pressure. While pressure will usually be in the range 2,000 to 10,000 psi, a machine able to deliver up to 16,000 psi is preferred to provide an ability to handle parts which may require higher pressures.

Strip heaters 9a on the fill chambers and heating elements 9b and 9c, in the form of heater tube cartridges, in the die halves and platens prevent premature solidification of the molten matrix material, before complete infiltration of the aggregate. Induction heaters and other devices may also be used to prevent premature solidification. In the case of aluminum alloy containing 10 wt. % silicon with a liquidus temperature of 585° C., solidus of 575° C., the walls of the die cavity and the fill chamber are controlled for instance to 250° C. for this purpose, in a case where input temperature of the molten metal into the fill chamber is 700° C. This temperature of 250° C. is below the solidus of this alloy, but it is an example of a temperature which retards heat loss sufficiently that infiltration can be completed, with solidification nevertheless occurring soon thereafter. Higher die temperatures can be used to further enhance infiltration. However, higher die temperatures can increase solidification time.

The piston may be cooled internally to, for instance, prevent it from becoming stuck inside the fill chamber due to thermal expansion and also to extract heat from the biscuit of matrix alloy left at the fill chamber beyond the extent of the forward stroke of the piston after the piston has been driven to the die cavity and infiltration has been completed.

The vacuum die caster of FIG. 1 illustrates the forming of box 72 discussed below with respect to the description of FIG. 4. A region of aggregate free matrix is created for the seal-band solder joint by making the aggregate preform of slightly lesser dimension than the die cavity.

Figure 1A:
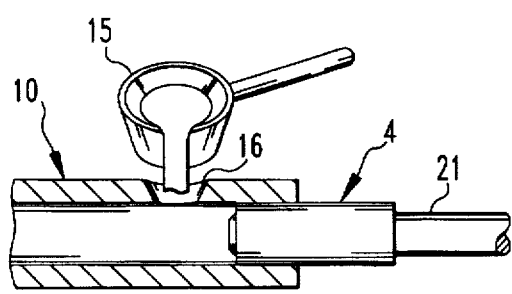
FIG. 1a corresponds to a part of FIG. 1 and shows an alternative metal input system.

The vacuum die caster of FIG. 1 uses vacuum to achieve charging of the fill chamber 10 through suction tube 6. This type of operation is more fully described in International Publication No. WO 90/10516. Figure 1a shows the metal pour charging technique used in the Examples described below. In this technique, a ladle 15 is used to pour molten aluminum through a charging orifice 16 in the top of the fill chamber.

Products

Figure 2A:
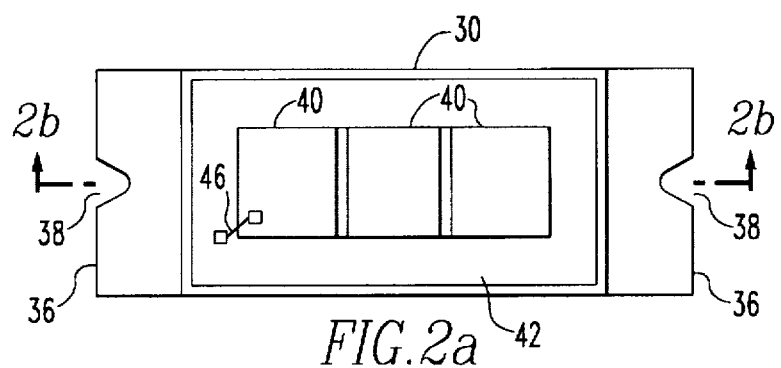
FIG. 2a is a plan view of a "microwave box" electronic package with lid removed.
Figure 2B:
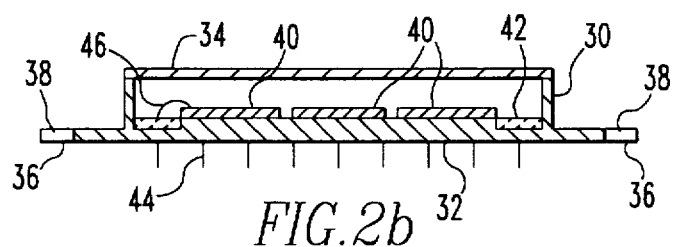
FIG. 2b is a cross-sectional view of the package of FIG. 2a obtained by the cutting plane 2b—2b.

Referring to FIGS. 2a and 2b, these figures show a microwave circuit package. The package is constructed of MMC products of the invention and includes a monolithic bottom section composed of seal band 30 and floor 32 and an upper section in the form of lid 34. Floor 32 is continued externally to form hold-down tabs 36, which are recessed at 38 for reception of a hold-down screw. Three integrated circuit chips 40 are soldered in place on a pedestal protruding upwards from the floor. An alumina substrate 42 surrounds the pedestal and contains conductive paths for electrically connecting different parts of the chips to pins 44 protruding through, and spaced by insulation from the walls of, holes in floor 32. Connection of the different parts of the chips to the conductive paths in the alumina is accomplished by jumper wires between pads on the chips and pads on the alumina. A representative set of pads and wire are shown at 46.

The box is sealed by a laser welding or low temperature soldering of the lid to the seal band. Examples of technology for accomplishing this sealing, as well as for preparing the aluminum alloy pedestal for the soldering of the chips to the pedestal, is contained in the following patents: U.S. Pat. Nos. 3,909,209, 4,270,986, 4,352,450, 4,591,088 (but something other than oil dip for heating, alternatives being furnace heating, local laser heating, or an electric resistance seam sealer), 4,613,069, 4,760,240, 4,946,090, and 4,958,763. In any of these processes which involve flux, precautions are preferred for removing residual flux. As indicated above in the description of the vacuum die casting part of this invention, these joining processes may be facilitated by provision during the die casting of a surface layer of aggregate-free matrix material.

Figure 3:
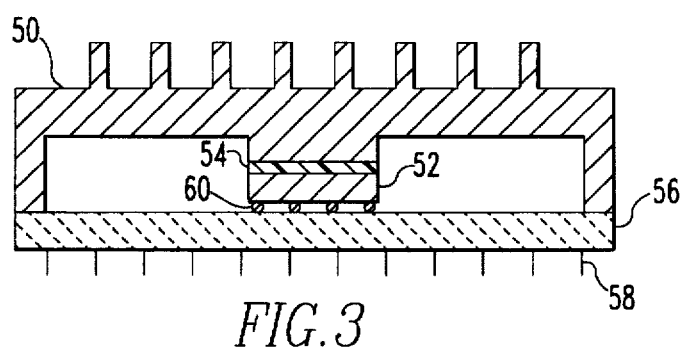
FIGS. 3 and 4 are cross-sectional views of heat exchanger equipped electronic packages.

With reference now to FIG. 3, this figure shows an electronic package. This package incorporates an MMC product of the invention in the form of a vacuum die cast, monolithic seal band/lid/heat exchanger combination 50. The heat exchanger may bear fins 51, which may be pin fins or plate fins. The monolith additionally has a pedestal on the underside of the lid. A representative integrated circuit chip 52 is mounted on this pedestal by way of an interposed compliant layer 54 having heat-conducting properties, such as Thermogrease or other thermoconductive bridge material. While this illustrates a single-chip module, it is evident that the concept of this embodiment may readily be expanded to provide for a multichip module.

It is to be noted that the use of "monolithic" herein is intended to indicate that units occur together as one piece without the interposition of a bonded joint, such as a brazed joint. Thus, for instance, it is known to make a heat-exchanger lid unit by brazing separate heat exchanger and lid units together.

The monolithic combination is sealed by low temperature soldering (low temperature, in order not to damage the integrated circuit) to the multilayer alumina substrate 56. Chip 52 is electrically connected to pins 58 using solder beads 60 contacting conductive paths through the alumina substrate.

The MMC material of the combination 50 contains proportions of aluminum alloy matrix and silicon carbide aggregate such that its coefficient of thermal expansion is near to, or matches, that of the alumina substrate 56, in order to avoid, or reduce, stressing of the seal at the MMC-alumina joint during thermal excursions caused, for instance, by heat emitted by the chip during its operation.

Figure 4:
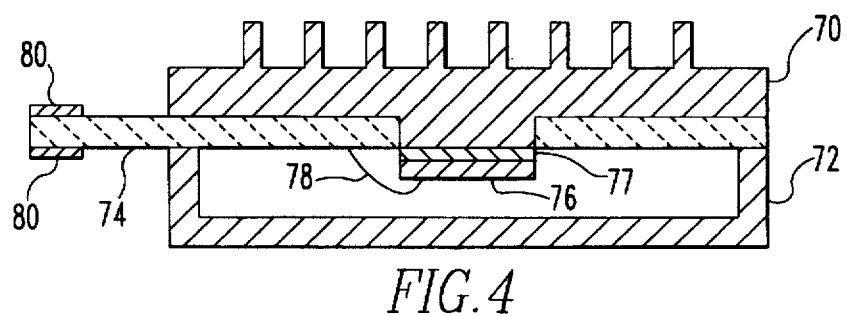

FIG. 4 illustrates an electronic package composed of an MMC monolithic lid/heat exchanger piece 70 and an MMC box 72 both soldered, for sealing, to a multilayer alumina substrate 74. The chip 76 is soldered by solder 77 to a pedestal on the lower side of the lid and is connected by wire bonding represented by wire 78, or any other suitable means, to an edge card connector 80.

To test the invention, MMC material for potential electronic package applications was manufactured. The goal for these applications is to produce material having a high thermal conductivity to remove heat generated by semiconductor devices, and a coefficient of thermal expansion (CTE) approaching or matching that of alumina, a chip substrate material typically used in electronic packaging. Furthermore, electronic packages must have very tight tolerance in dimension (as low as 0.001 inch) and surface flatness (0.001 inch), and those with integrated heat sinks have complex shapes.

In the following examples, preforms partially sintered to various temperatures and containing various volume % of SiC were infiltrated with molten metal to make the composites used for evaluation. Specifically, the thermal conductivity, the coefficient of thermal expansion and the total interfacial area of the resulting composite samples were measured.

Aluminum metal alloy containing approximately 10% silicon was selected as the infiltration material base. Aluminum and its alloys have thermal conductivity adequate for the present application.

EXAMPLES 1–3

SiC loading levels of 55 vol. %, 65 vol. % and 75 vol. % were evaluated. The SiC used for these examples was manufactured by Lonza, Inc. located in Fairlawn, N.J. The green preforms containing 55 vol. %, 65 vol. % and 75 vol. % silicon particulate were obtained from Technical Ceramic Laboratories, Inc., Alpharetta, Ga.

The preforms containing 55 vol. %, 65 vol. % and 75 vol. % silicon carbide particulate were first heated to about 500° C. (250° C./hr) and held for about one hour to burn off the organic binders without cracking the preform. Note that the rate of heating may vary depending on the size and shape of the preform as well as on the type of furnace. The preforms were then heated (or tacked) to about 700° C. in air and held for about one to eight hours. The preforms were placed in graphite molds and held at about 700° C., for a time sufficient for them to reach furnace temperatures, in a separate electric resistance furnace while the molten metal charge was prepared.

A molten metal charge for the matrix was prepared having a composition of Al-10% Si and held at approximately 700° C. The chemistry of the melt was checked. The die and fill chamber were cleaned, lubricated and preheated to about 250° C.

The partially sintered preform and graphite mold was placed inside the die cavity, and the die closed and locked. A fixed amount of molten metal was then placed in a fill chamber. The die cavity was then evacuated to remove air inside the mold and the preform. Upon completion of the evacuation, the molten metal was introduced to the cavity and was pressurized to infiltrate into the SiC inside the mold. After the molten metal solidified, the assembly was removed from the mold.

The resulting products were tested and it was determined that the products met the application requirements. The products exhibited a sufficiently high thermal conductivity and a CTE which approaches or matches that of material typically used for the construction or fabrication of electronic packaging. The products' total Al/SiC interfacial area was also measured to determine the relationship between thermal conductivity and the interface effects of the composite. The effect of the interface is particularly important for the case where the aggregate (or reinforcement), such as SiC, has an inherently high thermal conductivity.

Figure 5:
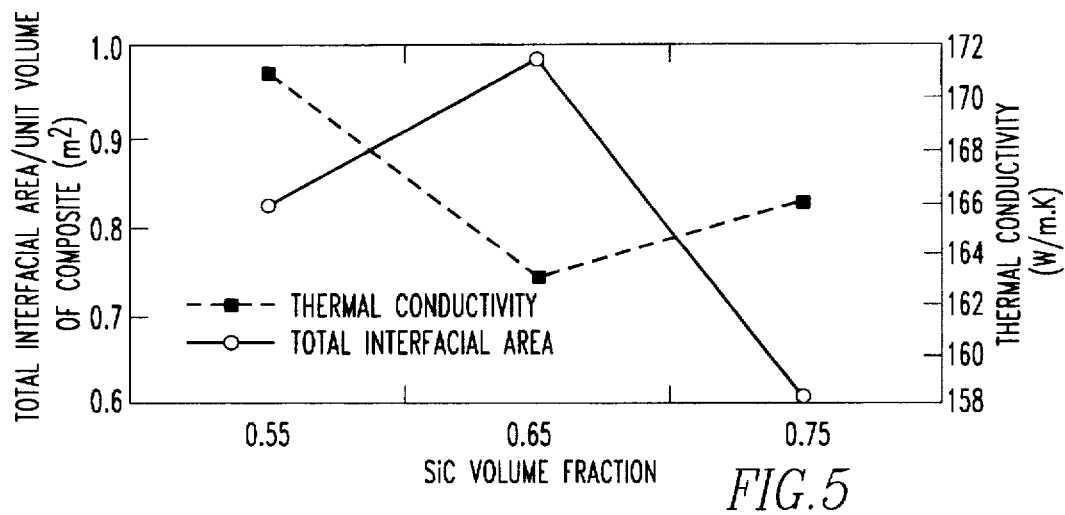
FIG. 5 is a plot of total interfacial area and thermal conductivity versus SiC aggregate volume fraction of tacked preforms.

Some of the test results are shown in Table 1 and plotted in FIG. 5. Table 1 demonstrates the effect that tacking preforms prior to sintering has on thermal conductivity, CTE, and surface area values. The results indicate that the total surface area increases with increasing vol. % SiC from 55% to 65% and then decreases for vol. % SiC from 65% to 75%. Conversely, thermal conductivity decreases with increasing vol. % SiC from 55% to 65% and then increases for vol. % SiC from 65% to 75%. These observations can be explained as follows: as the total surface area increases, the resistance offered by the interface to transfer of thermal energy increases, thus, decreasing overall thermal conductivity. Similarly, as total surface area decreases, the resistance decreases and overall conductivity increases.

TABLE 1

| Examples | Preform Solid Volume | Tacking Temperature °C. | Thermal Cond. W/m.K. | CTE ppm/K. | Surface Area m²/cc |
|---|---|---|---|---|---|
| 1 | 55 vol. % SiC | 700 | 171 | 9 | 1.50 |
| 2 | 65 vol. % SiC | 700 | 163 | 8 | 1.51 |
| 3 | 75 vol. % SiC | 700 | 166 | 6 | 0.81 |

Figure 6:
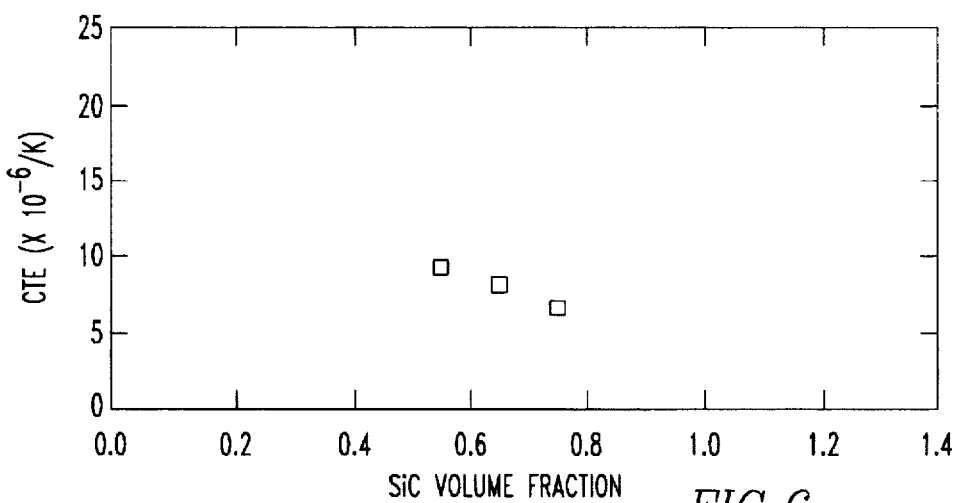
FIG. 6 is a plot of coefficient of thermal expansion versus SiC aggregate volume fraction of tacked preforms.

Test results indicating the CTE of the resulting composites are also shown in Table 1 and plotted in FIG. 6. The results indicate that the composites have CTE values in the range of 6.0 to 9.0 ppm/K which are similar to the CTE of alumina which is 6.6 ppm/K.

EXAMPLES 4–6

Preforms containing 65 vol. % silicon carbide particulate were processed similarly to the preforms of Examples 1–3. The 65 vol. % aggregate was chosen because based on the results of Examples 1–3, it resulted in a material having a very good combination of thermal conductivity and coefficient of thermal expansion. Preforms were partially sintered to 1700°, 1750° and 1850° C. prior to infiltrating with molten metal to measure the effect that preform partially sintering temperature has on thermal conductivity and on coefficient of thermal expansion values of the MMC material. All experienced a very high heating rate and were held for about one half of an hour at the designated temperature.

Again, the resulting products were tested, and it was determined that the products met the application requirements. The products exhibited a sufficiently high thermal conductivity and an appropriate CTE.

Figure 7:
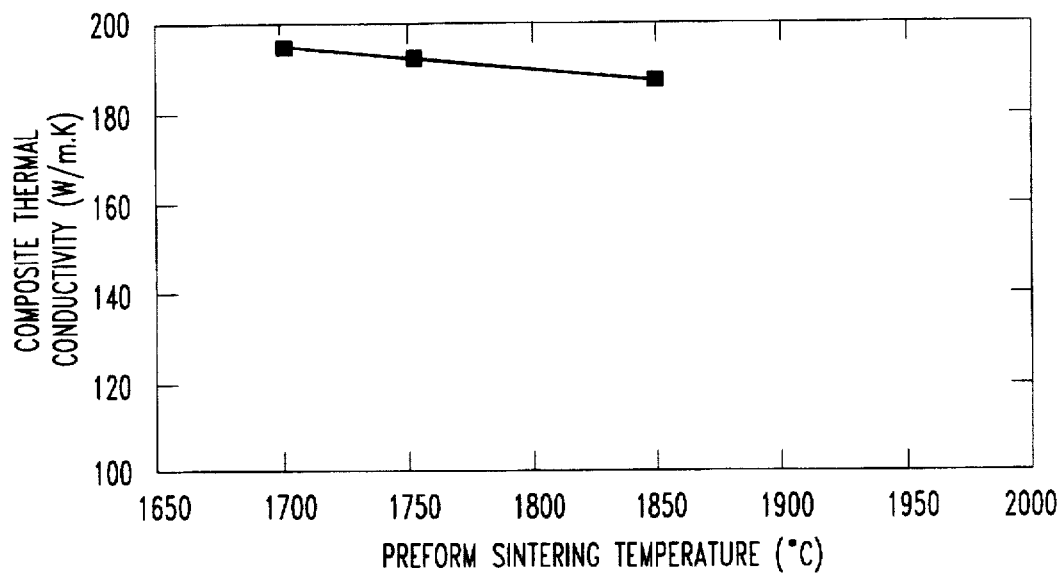
FIG. 7 is a plot of thermal conductivity versus preform partially sintering temperature.

The results, as shown in Table 2 and plotted in FIG. 7, demonstrate the dramatic effect that partially sintering the preforms prior to infiltration has on the thermal conductivity of the resulting composite. Surprisingly, partially sintering the preforms prior to infiltration, as shown in Examples 4–6, resulted in MMCs having much higher thermal conductivity than preforms that were only tacked as shown in Examples 1–3. The preform of Example 2, which was 65 vol. % SiC tacked to 700° C., resulted in a composite having a thermal conductivity of 163 W/m.K while the partially sintered preforms of Examples 4–6 resulted in composites having thermal conductivities exceeding 185 W/m.K, which is more than an 18% increase over the tacked preforms.

TABLE 2

| Examples | Preform Solid Volume | Partial Sintering Temperature °C. | Thermal Cond. W/m.K. | CTE ppm/K. |
|---|---|---|---|---|
| 5 | 65 vol. % SiC | 1700 | 196 | 8.45 |
| 6 | 65 vol. % SiC | 1750 | 195 | 8.7 |
| 7 | 65 vol. % SiC | 1850 | 188 | 8.4 |

Increasing the sintering temperature from 1700° C. to 1750° C. appears to have little effect on the thermal conductivity. The data, however, shows a small but noticeable drop with increasing the sintering temperature from 1750° to 1850° C. These effects may also be explained in terms of the changes in the interfacial area with sintering. Although not wishing to be bound by any theory, it is believed that the large initial increase at 1700° C. from the unsintered preform is likely due to the significant change in the microstructure of the preform. Specific surface area is expected to decrease significantly due to coalescence of the fine particles into larger ones. The resulting decrease in total surface area may have resulted in a corresponding increase in thermal conductivity. On sintering at higher temperatures, the additional decrease in surface area had no significant effect on thermal conductivity.

Figure 8:
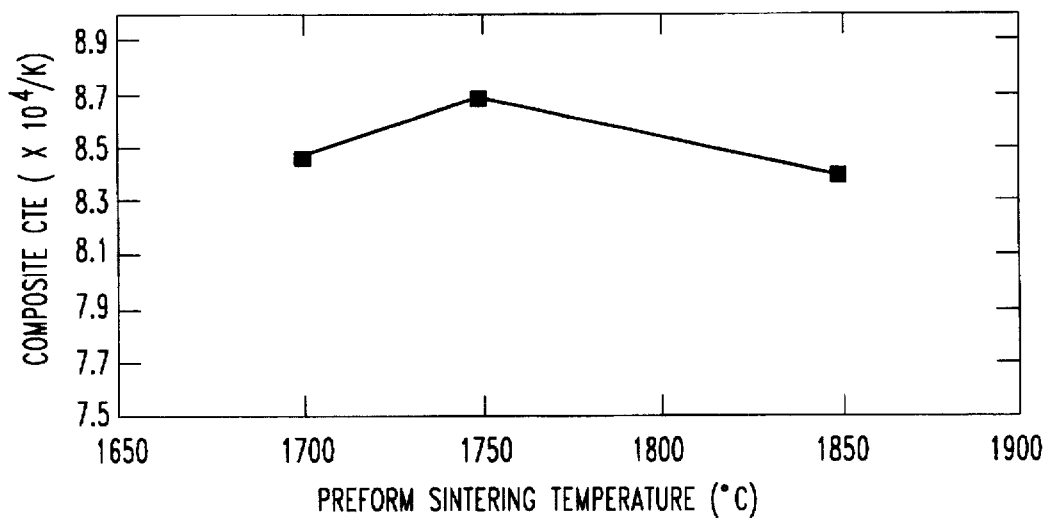
FIG. 8 is a plot of coefficient of thermal expansion versus preform partially sintering temperature.

The effect of sintering the preforms on the CTE of the composite is also shown in Table 2 and plotted in FIG. 8. CTE increases substantially from the unsintered value when the preform is sintered at 1700° C. It then increases with sintering temperature of 1750° C. to 8.7 ppm/K before decreasing. These changes in CTE may be understood in terms of the changes in the microstructure with respect to the SiC distribution. After sintering at 1700° C., it was observed that the fine SiC particles had coalesced into larger particles, locally altering the SiC distribution. This in turn increases the porosity of the preform, causing an overall increase in the CTE of the composite. Continuing sintering of the preform to temperatures such as 1850° to 1950° C. or even 2000° C., however, reduces the porosity of the preform. Thus, less metal is able to be infiltrated and the CTE of the composite decreases.

Whereas the preferred embodiments of the present invention have been described above in terms of being especially valuable in forming MMCs having an aluminum alloy matrix, it will be apparent to those skilled in the art that the present invention will also be valuable in MMCs from other metals. Metals suitable for use with the present invention are not limited to aluminum and aluminum alloys. MMCs formed from other metals such as copper, silver and gold and alloys thereof may also benefit from the present invention.

Whereas the preferred embodiments of the present invention have been described above in terms of being especially valuable in forming MMCs utilizing SiC as the reinforcement phase, it will be apparent to those skilled in the art that other reinforcement material can also be used. It is contemplated that other materials with high thermal conductivity, that are subjected to treatments that reduce their surface area without substantially changing their density, such as titanium carbide, aluminum nitride, titanium boride, zirconium boride, molybdenum, tungsten, and combinations thereof, may be used as reinforcement materials.

Whereas the preferred embodiments of the present invention have been described in terms of allowing the liquid-phase metal to solidify, it will be apparent to those skilled in the art that the invention is not so limited. It is contemplated that the solidification of the liquid-phase metal may be accelerated by cooling techniques, which include circulating cool air over the surface of the mold and/or formed product. The word "cool" is intended to be relational to the solidifying metal. In this regard, cool air has a temperature that is lower than the temperature of the solidifying metal. Cool air may be considerably warmer than normal ambient temperature (68° F.).

Whereas the invention has been described in terms of graphite molds, other mold materials may be used such as steel molds and others known in the art.

Whereas the invention has been described in terms of the use of a die casting machine which applies a vacuum to the mold chamber to assist infiltration, the invention is not so limited. It is also contemplated that the metal can be infiltrated from one end of the die cavity to produce a moving front of liquid-phase metal which sweeps gas contained in the pores of the preform from one end of the mold to the other end of the mold without entrapping gas in the form of pores within the preform. It is further contemplated that wetting agents, such as for example $TiB_2$, can be formed on the surfaces of the preform and/or insulating material to increase the wettability of the molten metal to the porous preform and reduce the probability of entrapping gas in the preforms.

Whereas the invention has been described in terms of the use of separately heated dies, it is not intended that the invention is so limited. The dies can be permanently attached to the die casting equipment and the preform heated separately or in-situ.

What is believed to be the best mode of the invention has been described above. However, it will be apparent to those skilled in the art that numerous variations of the type described could be made to the present invention without departing from the spirit of the invention. The scope of the present invention is defined by the broad general meaning of the terms in which the claims are expressed.

What is claimed is:

1. A method of fabricating a metal matrix composite having a combination of high thermal conductivity and a good coefficient of thermal expansion, said method comprising:

(a) preparing a formed agglomeration of powder particles, and tacking the formed agglomeration of powder particles by heating the formed agglomeration to a temperature between 600° and 1000° C. in an oxidizing atmosphere to oxidize the powder particles to bond the powder particles of the agglomeration together;

(b) partially sintering said formed agglomeration by heating the formed agglomeration to a temperature between approximately 1650° and 2000° C. in a substantially inert atmosphere;

(c) placing said partially sintered agglomeration in a die cavity;

(d) infiltrating said partially sintered agglomeration with a liquid-phase metal; and (e) solidifying said liquid-phase metal to form said metal matrix around and through said partially sintered agglomeration.

2. The method of claim 1 wherein the formed agglomeration of (a) is comprised of silicon carbide.

3. The method of claim 1 wherein the formed agglomeration of (a) is selected from the group consisting of titanium carbide, aluminum nitride, titanium boride, zirconium boride, molybdenum, tungsten and combinations thereof.

4. The method of claim 1 wherein the formed agglomeration contains from about 50 to 80% solids by volume.

5. The method of claim 1 wherein the formed agglomeration contains about 85% solids by volume.

6. The method of claim 1 wherein the liquid-phase metal of (d) is aluminum.

7. The method of claim 1 wherein the liquid-phase metal of (d) is selected from the group consisting of aluminum, copper, silver, gold and alloys thereof.

8. The method of claim 1 wherein the formed agglomeration of (a) is fabricated by a forming method selected from the group consisting of dry pressing, slip casting, injection molding, pressing, hot pressing and hot isostatic pressing.

9. The method of claim 1 wherein (c) further comprises: placing said partially sintered agglomeration in a die cavity, said partially sintered agglomeration having a temperature of between approximately 500° and 850° C.

10. The method of claim 1 wherein the partially sintered agglomeration is cooled to room temperature, after (b) and heated to a temperature between approximately 550° and 850° C. prior to (c).

11. A method of fabricating an aluminum matrix composite having a combination of high thermal conductivity and a coefficient of thermal expansion which allows it to be used with ceramics and semi-conductors, said method comprising:

(a) preparing a formed agglomeration of silicon carbide powder particles;

(b) heating said formed agglomeration to a temperature between approximately 600° and 1000° C. in an oxidizing atmosphere to oxidize the silicon carbide powder particles to bond the powder particles together;

(c) heating said formed agglomeration to a temperature between approximately 1650° and 2000° C. in a non-oxidizing atmosphere to form a partially sintered agglomeration;

(d) bringing said partially sintered agglomeration to a temperature between approximately 550° and 850° C.;

(e) placing said partially sintered agglomeration in a die cavity heated to a temperature between approximately 1500° and 500° C.;

(f) infiltrating said partially sintered agglomeration with a liquid-phase aluminum alloy;

(g) solidifying said liquid-phase aluminum alloy to form said aluminum matrix around and through said partially sintered agglomeration.

12. The method of claim 11 wherein the formed agglomeration is cooled approximately to room temperature after (c) and heated to a temperature between approximately 550° and 850° C. in (d).

13. The method of claim 11 wherein said non-oxidizing atmosphere is selected from the group consisting of a reducing atmosphere, an atmosphere formed substantially from an inert gas and a vacuum.

14. The method of claim 11 wherein (e) further comprises:

placing said partially sintered agglomeration in a die cavity, said partially sintered agglomeration having a temperature of between approximately 500° and 850° C.

15. The method of claim 11 wherein the formed agglomeration contains from about 50 to 80% solids by volume.

16. The method of claim 11 wherein the metal matrix composite has a thermal conductivity greater than 175 W/m-K.

17. The method of claim 11 wherein the metal matrix composite has a thermal conductivity greater than 185 W/m-K.

18. The method of claim 11 wherein the metal matrix composite has a thermal conductivity greater than 195 W/m-K.

19. The method of claim 11 wherein the metal matrix composite has a thermal conductivity greater than 175 W/m-K and a coefficient of thermal expansion less than 9 ppm/K.

20. The method of claim 11 wherein the metal matrix composite has a thermal conductivity greater than 185 W/m-K and a coefficient of thermal expansion less than 9 ppm/K.

21. The method of claim 11 wherein the metal matrix composite has a thermal conductivity greater than 195 W/m-K and a coefficient of thermal expansion less than 9 ppm/K.

22. The method of claim 11 wherein the formed agglomeration of (c) is heated to approximately 1800° C. in a substantially reducing atmosphere.

23. The method of claim 11 in which (a) includes: heating a formed agglomeration to a temperature between about 300° and 500° C.

24. The method of claim 11 in which said liquid-phase aluminum alloy contains 0.1% to 25% silicon.

* * * * *

UNITED STATES PATENT AND TRADEMARK OFFICE
CERTIFICATE OF CORRECTION

PATENT NO. : 5,775,403
DATED : July 7, 1998
INVENTOR(S) : Mosur K. Premkumar et al.

It is certified that error appears in the above-identified patent and that said Letters Patent is hereby corrected as shown below:

Col. 13, line 25, Claim 11          Change "1500°" to --150°--.

Signed and Sealed this

Twenty-seventh Day of October, 1998

Attest:

BRUCE LEHMAN

Attesting Officer          Commissioner of Patents and Trademarks